(12) United States Patent  
Moon et al.

(10) Patent No.: US 9,257,456 B2  
(45) Date of Patent: Feb. 9, 2016

(54) METHOD OF FORMING A METAL PATTERN AND METHOD OF MANUFACTURING A DISPLAY SUBSTRATE

(71) Applicant: Samsung Display Co., Ltd., Yongin (KR)

(72) Inventors: Young-Min Moon, Seongnam-si (KR); Hong-Sick Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/541,878

(22) Filed: Nov. 14, 2014

(65) Prior Publication Data  
US 2015/0380443 A1   Dec. 31, 2015

(30) Foreign Application Priority Data  
Jun. 26, 2014  (KR) ........................ 10-2014-0079226

(51) Int. Cl.  
*H01L 27/12* (2006.01)  
*H01L 29/423* (2006.01)

(52) U.S. Cl.  
CPC ...... *H01L 27/1259* (2013.01); *H01L 29/42372* (2013.01)

(58) Field of Classification Search  
None  
See application file for complete search history.

(56) References Cited

U.S. PATENT DOCUMENTS 6,031,261 A  *  2/2000  Kang .................... H01L 21/266  
257/302

FOREIGN PATENT DOCUMENTS

| KR | 10-1995-0007139 | 3/1995 |
| KR | 10-2001-0063866 | 7/2001 |
| KR | 10-2005-0070240 | 7/2005 |
| KR | 10-2009-0100186 | 9/2009 |
| KR | 10-2009-0112971 | 10/2009 |

* cited by examiner

*Primary Examiner* — Bilkis Jahan  
*Assistant Examiner* — Kevin Quinto  
(74) *Attorney, Agent, or Firm* — H.C. Park & Associates, PLC

(57) ABSTRACT

A method of forming a metal pattern includes disposing a gate metal layer on a substrate; disposing a photoresist layer on the gate metal layer; etching portions of the photoresist layer to form a first photo pattern; etching portions of the gate metal layer to form a gate pattern including a gate electrode, in which the gate metal layer is patterned using the first photo pattern as a mask; ashing an end portion of the first photo pattern to form a second photo pattern; disposing a first gate insulating layer over the substrate and the second photo pattern; removing the second photo pattern and a portion of the first gate insulating layer disposed over the second photo pattern; and disposing a second insulating layer over the gate pattern and the remaining portions of the first gate insulating layer.

20 Claims, 7 Drawing Sheets

METHOD OF FORMING A METAL PATTERN AND METHOD OF MANUFACTURING A DISPLAY SUBSTRATE

CROSS-REFERENCE TO RELATED APPLICATION

This application claims priority from and the benefit under 35 U.S.C. §119(a) of Korean Patent Application No. 10-2014-0079226, filed on Jun. 26, 2014, the entire disclosure of which is incorporated by reference herein for all purposes.

BACKGROUND

1. Field

The following disclosure relates to a method of forming a metal pattern and a method of manufacturing a display substrate.

2. Discussion of the Background

Generally, a display substrate used in a display device includes a thin-film transistor ("TFT") as a switching element for driving a pixel region, a signal line connected to the TFT, and a pixel electrode. The signal line includes a gate line transmitting a gate driving signal and a data line crossing the gate line and transmitting a data driving signal.

As size of the display device is increased and customer demand for higher resolution is increased, a width of a gate pattern or a data pattern is decreased so that an electric resistance is increased. Thus, a resistance-capacitance ("RC") signal delay may occur, and the gate pattern or the data pattern may be formed from a metal having a relatively low resistance, and a thickness of the gate pattern or the data pattern may be increased in order to prevent the RC signal delay.

When a thickness of the gate pattern increases, a taper angle of the gate pattern may be increased. Thus, a crack of an insulating layer adjacent to the gate pattern may occur so that a quality of the display apparatus is poor.

SUMMARY

Exemplary embodiments of the present invention provide a method of forming a metal pattern including a double gate insulating layer to cover a gate pattern for forming a fine metal pattern.

Exemplary embodiments of the present invention also provide a method of manufacturing the above-mentioned display substrate including the fine metal pattern.

Additional features of the invention will be set forth in the description which follows, and in part will be apparent from the description, or may be learned by practice of the invention.

Exemplary embodiments of the present invention provide a method of forming a metal pattern, including disposing a gate metal layer on a substrate; disposing a photoresist layer on the gate metal layer; etching portions of the photoresist layer to form a first photo pattern; etching portions of the gate metal layer to form a gate pattern including a gate electrode, in which the gate metal layer is patterned using the first photo pattern as a mask; ashing an end portion of the first photo pattern to form a second photo pattern; disposing a first gate insulating layer over the substrate and the second photo pattern; removing the second photo pattern and a portion of the first gate insulating layer disposed over the second photo pattern; and disposing a second insulating layer over the gate pattern and the remaining portions of the first gate insulating layer.

Exemplary embodiments of the invention provide a method of manufacturing a display panel including forming a display substrate; disposing a plurality of gate lines; disposing a plurality of data lines; and disposing a plurality of pixels. The forming the display substrate includes: disposing a gate metal layer on a substrate; disposing a photoresist layer on the gate metal layer; etching portions of the photoresist layer to form a first photo; etching portions of the gate metal layer to form a gate pattern including a gate electrode, in which the gate metal layer is patterned using the first photo pattern as a mask; ashing an end portion of the first photo pattern to form a second photo pattern; disposing a first gate insulating layer over the substrate and the second photo pattern; removing the second photo pattern and a portion of the first gate insulating layer disposed over the second photo pattern; and disposing a second insulating layer over the gate pattern and the remaining portions of the first gate insulating layer.

It is to be understood that both the foregoing general description and the following detailed description are exemplary and explanatory and are intended to provide further explanation of the invention as claimed. Other features and aspects will be apparent from the following detailed description, the drawings, and the claims.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
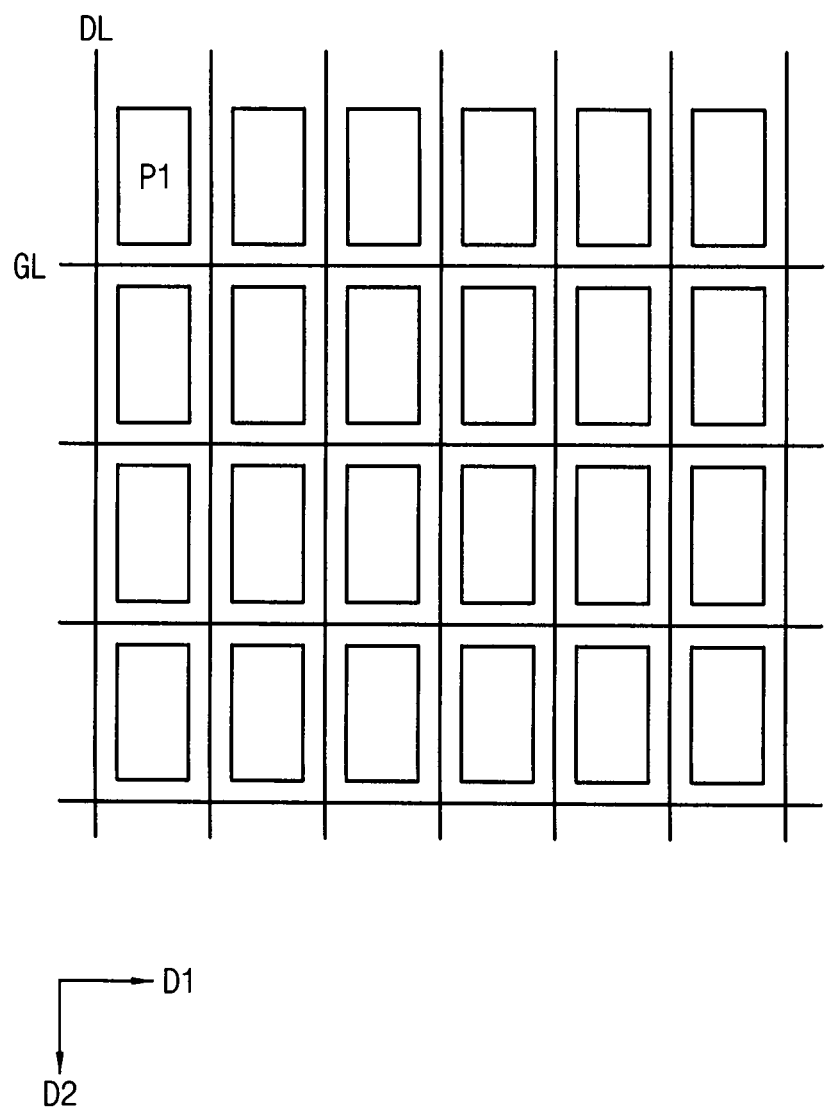
FIG. 1 is a plan view illustrating a display substrate according to exemplary embodiments of the present invention.

Exemplary embodiments of the present invention will be described in more detail with reference to the accompanying drawings. These exemplary embodiments will be described in detail for those skilled in the art in order to practice the present invention. It should be appreciated that various exemplary embodiments of the present invention are different but do not have to be exclusive. For example, specific shapes, configurations, and characteristics described in an exemplary embodiment of the present invention may be implemented in another exemplary embodiment without departing from the spirit and the scope of the present invention. In addition, it should be understood that position and arrangement of individual components in each disclosed exemplary embodiment may be changed without departing from the spirit and the scope of the present invention. Therefore, a detailed description described below should not be construed as being restrictive. In addition, the scope of the present invention is defined only by the accompanying claims and their equivalents if appropriate. Similar reference numerals will be used to describe the same or similar functions throughout the accompanying drawings. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

The terminology used herein is for the purpose of describing exemplary embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements and/or components, but do not preclude the presence or addition of one or more other features, integers, steps, operations, elements, components, and/or groups thereof.

It will be understood that when an element is referred to as being "connected to" another element, it can be directly connected to the other element, or intervening elements may be present.

Hereinafter, exemplary embodiments will be described in detail with reference to the accompanying drawings.

FIG. 1 is a plan view illustrating a display substrate according to exemplary embodiments of the present invention.

Referring to FIG. 1, a display panel includes a plurality of gate lines GL, a plurality of data lines DL and a plurality of pixels.

The gate lines GL may extend in a first direction D1. The data lines DL may extend in a second direction D2 substantially perpendicular to the first direction D1. Alternatively, the gate lines GL may extend in the second direction D2 and the data lines DL may extend in the first direction D1.

The pixels may be arranged in a matrix shape. The pixels may be disposed in areas defined by the gate lines GL and the data lines DL.

Each pixel may be connected to a corresponding gate line GL and a corresponding data line DL, both of which may be located adjacent to the pixel.

Each pixel may have a rectangle shape extending in the second direction D2. However, aspects of the invention are not limited thereto, such that the pixel may extend in a first direction D1 or have a V-shape, a Z-shape or the like.

Figure 2:
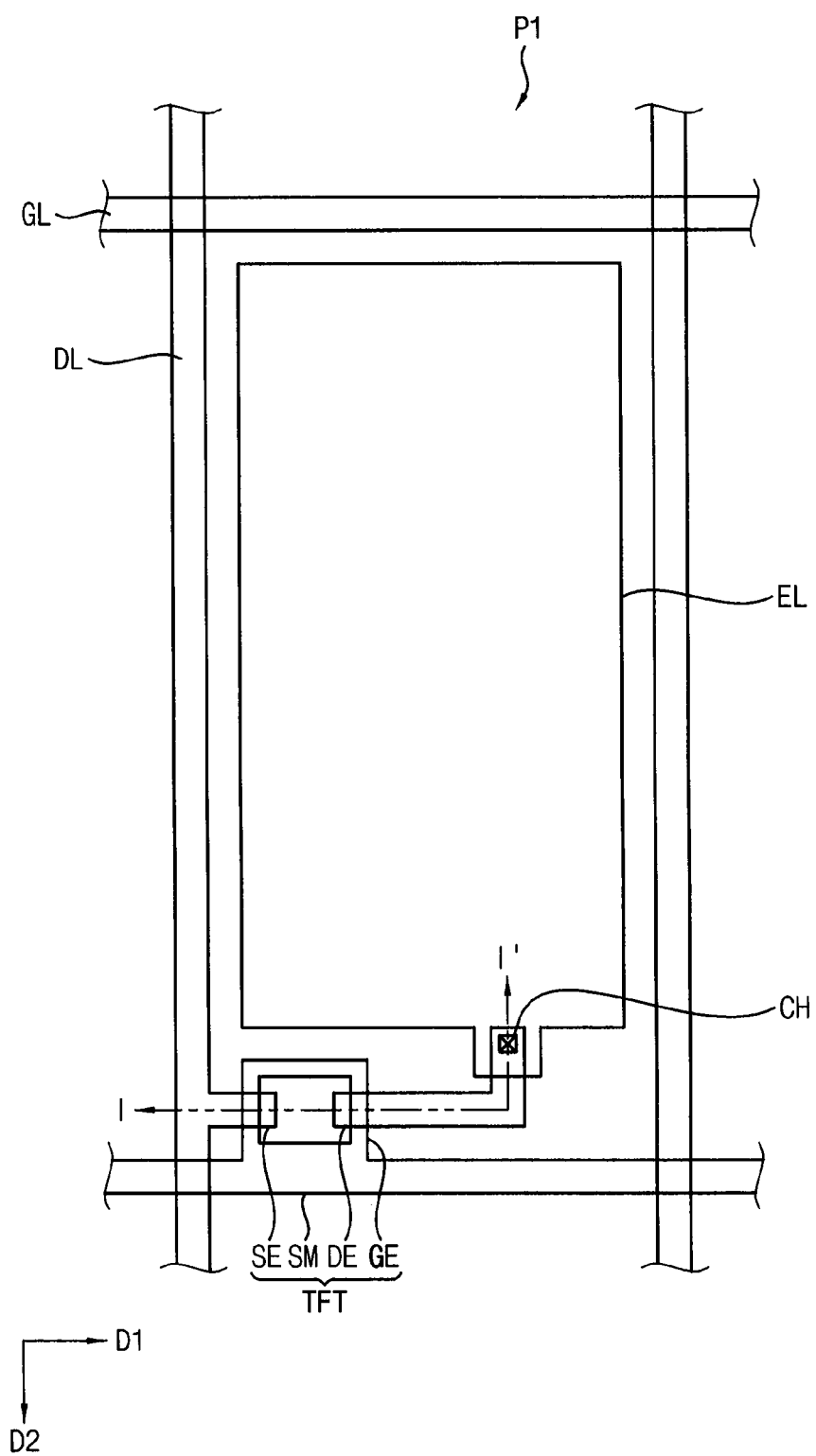
FIG. 2 is a plan view illustrating a first pixel of the display panel in FIG. 1.
Figure 3:
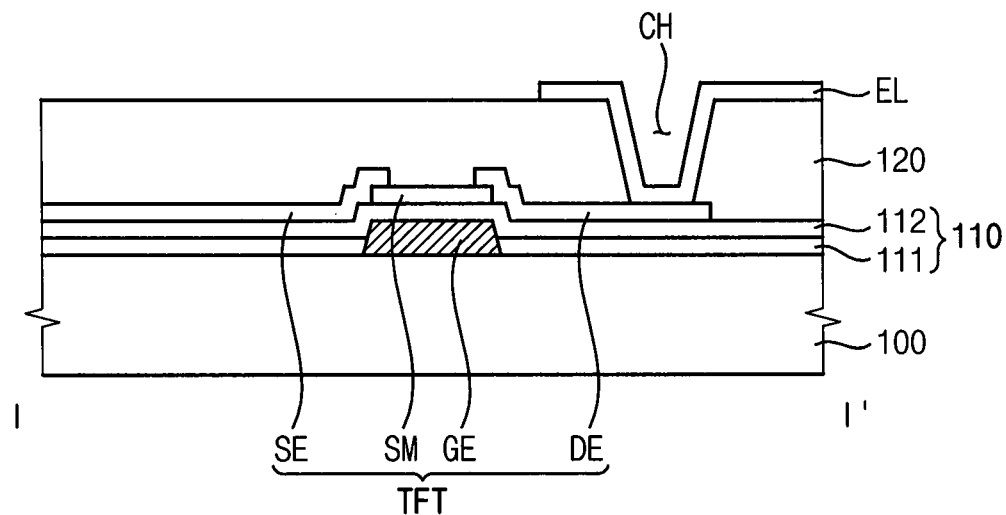
FIG. 3 is a cross-sectional view taken along the line I-I' in FIG. 2.

FIG. 2 is a plan view illustrating a first pixel of the display panel in FIG. 1. FIG. 3 is a cross-sectional view taken along the line I-I' in FIG. 2.

Referring to FIG. 1, FIG. 2, and FIG. 3, the display substrate includes a base substrate 100, thin film transistors TFT, a gate insulating layer 110, a data insulating layer 120 and an electrode EL.

The base substrate 100 may be a transparent insulating substrate. Examples of a transparent insulating substrate may include, but are not limited to, a glass substrate, a plastic substrate or the like. The base substrate 100 may include a plurality of pixel areas for displaying an image. A plurality of the pixel areas may be disposed in a matrix shape having a plurality of rows and a plurality of columns.

Each pixel may further include a switching element. For example, the switching element may be a thin film transistor TFT. The switching element may be connected to the gate line GL and the data line DL, which may be disposed adjacent to the switching element. The switching element may be disposed at a crossing area of the gate line GL and the data line DL.

A gate pattern may include a gate electrode GE and the gate line GL. The gate pattern may be disposed on the substrate 100. The gate line GL may be electrically connected to the gate electrode GE.

The gate insulating layer 110 may be disposed on the substrate 100 to cover or overlap at least a portion of the gate pattern and may insulate the gate pattern.

The gate insulating layer 110 includes a first gate insulating layer 111 and a second gate insulating layer 112.

The first insulating layer 111 is disposed on the base substrate 100. The first insulating layer 111 may be disposed adjacent to the gate pattern. However, the first insulating layer 111 may not be overlapped with the gate pattern. For example, a thickness of the first gate insulating layer 111 may be smaller than a thickness of the gate pattern. A side or end portion of the first gate insulating layer 111 may contact with a side or end portion of the gate pattern. When the first gate insulating layer 111 does not make contact with the gate pattern, a crack on an upper surface of the second gate insulating layer 112 may occur.

The second gate insulating layer 112 is disposed on the first gate insulating layer 111. The second gate insulating layer 112 may cover or overlap at least a portion of the gate pattern and the first gate insulating layer 111. Further, the second gate insulating layer 112 may insulate the gate pattern.

A semiconductor pattern SM may be disposed on the gate insulating layer 110. The semiconductor pattern SM may overlap at least a portion of the gate electrode GE.

A data pattern may include the data line DL, a source electrode SE and a drain electrode DE. The data pattern may be disposed on the semiconductor pattern SM, which may be formed or disposed on the gate insulating layer 110. The source electrode SE may overlap at least a portion of the semiconductor pattern SM. The source electrode SE may be electrically connected to the data line DL.

A portion of the drain electrode DE and a portion of the source electrode SE may be disposed on the semiconductor pattern SM. Further, the portions of the drain electrode DE and the source electrode SE may be spaced apart from each other. The semiconductor pattern SM may have a conductive channel between the source electrode SE and the drain electrode DE.

The TFT may include the gate electrode GE, the source electrode SE, the drain electrode DE and the semiconductor pattern SM.

The data insulating layer 120 may be disposed on the gate insulating layer 110. The data insulating layer 120 may insulate the data pattern.

The gate insulating layer 110 and the data insulating layer 120 may include, without limitation, an organic insulating material or an inorganic insulating material. For example, the gate insulating layer 110 and the data insulating layer 120 may include silicon oxide ($SiO_x$) or silicon nitiride ($SiN_x$).

The data insulating layer 120 may have a contact hole CH exposing the drain electrode DE.

The electrode EL may be disposed on a pixel area. The electrode EL may be disposed on the data insulating layer 120. The electrode EL may be electrically connected to the drain electrode DE through the contact hole CH. The electrode EL may be electrically connected to the TFT. A grayscale voltage may be applied to the electrode EL through the TFT. For example, the electrode EL may have a slit pattern or other patterns.

For example, the electrode EL may include a transparent conductive material, such as indium tin oxide (ITO), indium zinc oxide (IZO), aluminum zinc oxide (AZO), and the like.

FIGS. 4A to 4H are cross-sectional views illustrating a method of manufacturing a display substrate according to exemplary embodiments of the present invention.

Referring to FIGS. 4A to 4H, operations of forming a metal pattern and manufacturing a display substrate are illustrated in more detail.

Figure 4A:
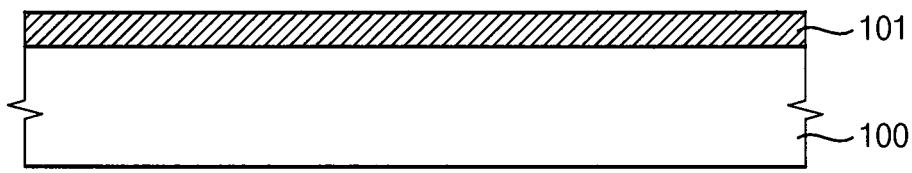
FIGS. 4A to 4H are cross-sectional views illustrating a method of manufacturing a display substrate according to exemplary embodiments of the present invention.

Referring to FIG. 4A, a metal layer 101 is formed or disposed on a base substrate 100. The metal layer 101 may include, for example, a copper layer. The copper layer may include copper (Cu) or copper alloy. However, aspects of the invention are not limited thereto, such that the metal layer 101 may include different metals having similar properties or a combination of metals to have similar properties as a copper layer.

A thickness of the metal layer 101 may be about 5000 Å. For example, a thickness of the gate pattern is within a range of about 1 μm to about 3 μm.

Figure 4B:
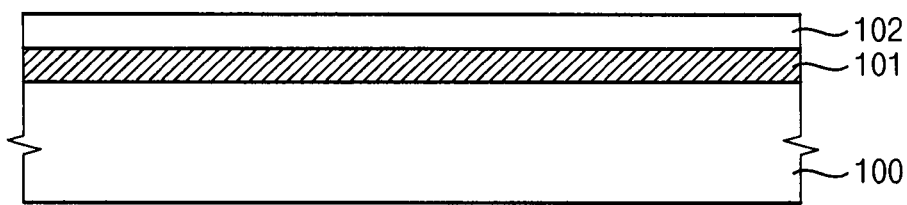
Figure 4C:
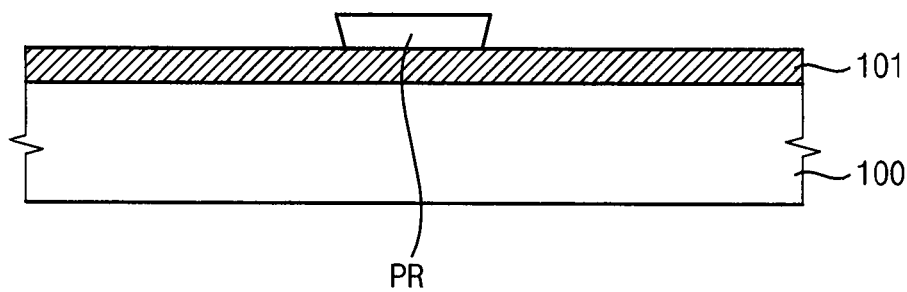

Referring to FIG. 4B and FIG. 4C, a photoresist material is coated on the metal layer 101 to form a photoresist layer 102. The photoresist layer 102 may be exposed using, without limitation, a mask disposed thereon. The photoresist layer 102 may be developed and then etched to form a first photo pattern PR. The first photo pattern PR may be formed at a position where a gate pattern or a gate electrode is to be formed. More specifically, the first photo pattern PR may be formed at a position or over where a gate electrode GE is to be formed from the metal layer 102. Further, the first photo pattern PR may have a reverse taper shape so that the first photo pattern PR may be easily lifted off or removed. The reverse taper shape of the first photo pattern PR may be such that a side of the first photo pattern PR closest to the substrate 100 may be narrower than a side of the first photo pattern PR. For example, the photoresist material may include a well-known photoresist composition to form a photo pattern having a reverse taper shape.

Figure 4D:
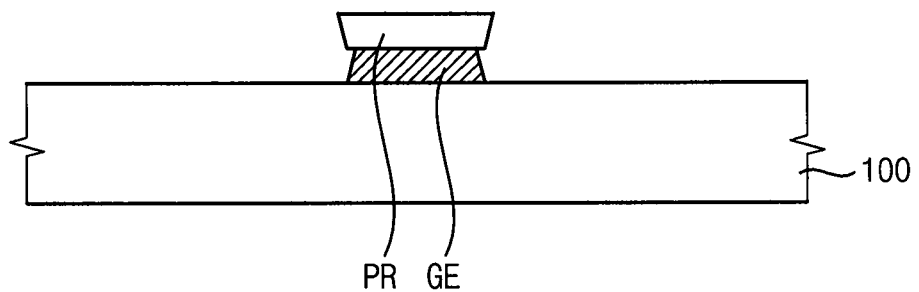

Referring to FIG. 4D, the metal layer 101 may be etched by using the first photo pattern PR as an etch stopper to form a gate pattern including a gate electrode GE. For example, a width of the gate pattern or the gate electrode GE may be equal to or less than about 0.5 μm.

For example, a taper angle of the gate pattern or the gate electrode GE may be within a range of about 60° to about 90° with respect to the substrate 100.

The metal layer 101 may be etched using an etching composition. For example, the etching composition may include ammonium persulfate ($(NH_4)_2S_2O_8$), which is an oxidant. The ammonium persulfate may be a main ingredient that may be used for etching a copper layer. The ammonium persulfate may etch a copper layer to form a copper sulfate ($CuSO_4$).

A width of the gate pattern or gate electrode GE may be smaller than a width of the photo pattern PR according to a characteristic of a wet etching process. Thus, an end or edge of the gate pattern or gate electrode GE and an end or edge of the first photo pattern PR may be not aligned with each other.

The gate insulating layer 110 may be formed using, without limitation, a sputtering process.

When an end or edge of the gate electrode GE and an end or edge of the first photo pattern PR are not aligned with each other, a portion of the first gate insulating layer 111, which is to be disposed adjacent to a side portion of the gate electrode GE, may be not formed, such that the first gate insulating layer 111 and the gate electrode GE are not in contact with one another. Therefore, when the first photo pattern PR is removed and the portion of the first gate insulating layer 111 and the gate electrode GE are not in contact with one another, and then the second gate insulating layer 112 is formed thereon, a crack on the second gate insulating layer 112 may occur.

Figure 4E:
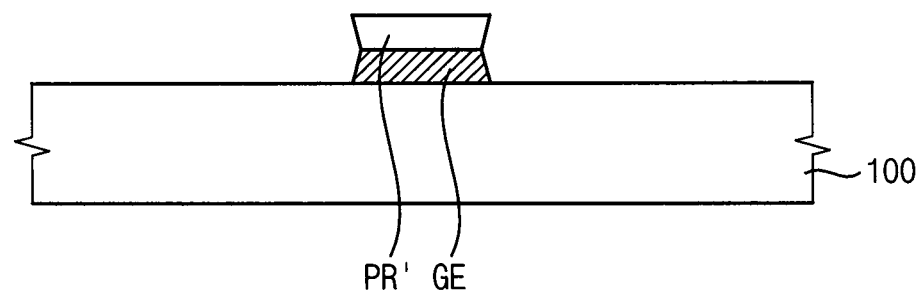

Referring to FIG. 4E, a side surface or portion of the first photo pattern PR may be ashed to form a second photo pattern PR'.

For example, the side portions of the first photo pattern PR may be ashed by a plasma ashing process so that the second photo pattern PR' may be formed. Further, the base substrate 100 including the first photo pattern PR may be disposed in a reaction chamber. Plasma from a gas mixture of oxygen and nitrogen may be generated in the reaction chamber. The base substrate 100 may be exposed to the plasma, such that the side surface or portion of the first photo pattern PR may be ashed to form the second photo pattern PR'.

An end or edge of the second photo pattern PR' and an end or edge of the gate electrode GE may be aligned with each other. For example, a width of the second photo pattern PR' may be the same or similar within a reference tolerance as a width of the gate pattern or the gate electrode GE. When the gate insulating layer 110 is formed, a crack on the gate insulating layer adjacent to the gate electrode GE may be prevented or hindered from forming.

For example, the second photo pattern PR' may have a reverse taper shape so that the second photo pattern PR' may be easily lifted off or removed. For example, a taper angle of the second photo pattern PR' may be within a range of about 90° to about 120° with respect to the substrate 100.

Figure 4F:
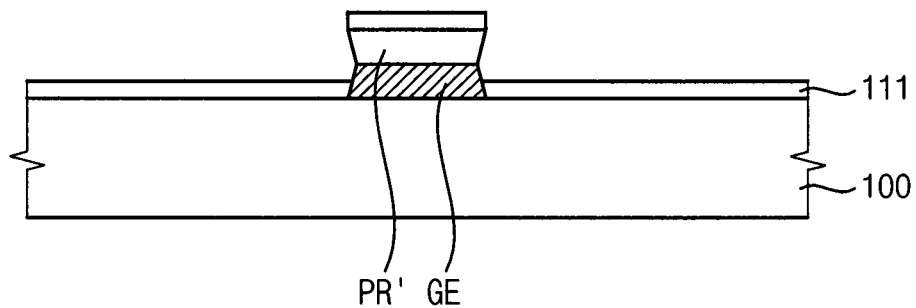

Referring to FIG. 4F, an insulating material is coated on the second photo pattern PR' and the base substrate 100 to form a first gate insulating layer 111. For example, the first gate insulating layer 111 may be formed using a sputtering process.

The first gate insulating layer 111 may be formed on a partial or entire surface of the base substrate 100. A thickness of the first gate insulating layer 111 may be smaller than a thickness of the gate electrode GE. The first gate insulating layer 111 may be formed on an upper surface of the second photo pattern PR'. The first gate insulating layer 111 may be cut at side surfaces of the gate electrode GE and the second photo pattern PR'.

The insulating material may include, without limitation, silicon oxide ($SiO_x$) or silicon nitride ($SiN_x$).

Figure 4G:
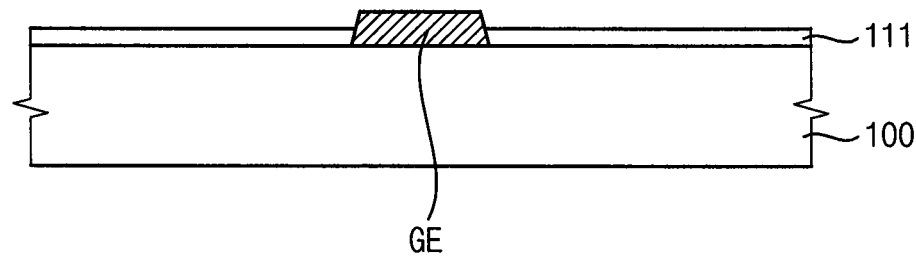

Referring to FIG. 4G, the second photo pattern PR' is removed and a portion of the first gate insulating layer 111 disposed on the second photo pattern PR' may be lifted off or removed. For example, the second photo pattern PR' and the portion of the first gate insulating layer 111 may be removed at the same time. When the second photo pattern PR' and a portion of the first gate insulating layer 111 disposed thereon are removed, an upper surface of the gate pattern including the gate electrode GE may be exposed.

Figure 4H:
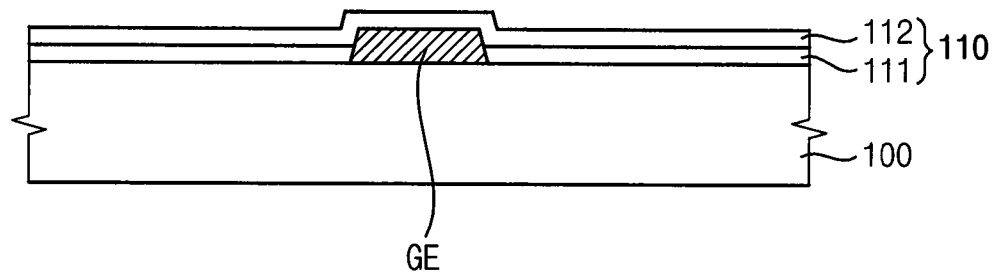

Referring to FIG. 4H, an insulating material is coated or disposed to cover the gate pattern including the gate electrode GE and the first gate insulating layer 111 to form a second gate insulating layer 112. Therefore, the second insulating layer 112 may cover the base substrate 100 and the gate pattern. The gate insulating layer 110 may include the first gate insulating layer 111 and the second gate insulating layer 112.

In accordance with exemplary embodiments of the inventive concept, the method of forming a fine metal pattern and the method of manufacturing the display substrate may apply to a liquid crystal display apparatus or an organic electroluminescent apparatus. However, aspects of the invention are not limited thereto, such that the methods may be applied to different display apparatuses.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is captured by the following claims, with equivalents of the claims to be included therein.

What is claimed is:

1. A method of forming a metal pattern, comprising:
   disposing a gate metal layer on a substrate;
   disposing a photoresist layer on the gate metal layer;
   etching portions of the photoresist layer to form a first photo pattern;
   etching portions of the gate metal layer to form a gate pattern comprising a gate electrode, wherein the gate metal layer is patterned using the first photo pattern as a mask;
   ashing an end portion of the first photo pattern to form a second photo pattern;
   disposing a first gate insulating layer over the substrate and the second photo pattern;
   removing the second photo pattern and a portion of the first gate insulating layer disposed over the second photo pattern; and
   disposing a second insulating layer over the gate pattern and the remaining portions of the first gate insulating layer.

2. The method of claim 1, wherein a thickness of the first gate insulating layer is smaller than a thickness of the gate pattern.

3. The method of claim 1, wherein a thickness of the gate pattern is within a range of about 1 μm to about 3 μm.

4. The method of claim 1, wherein the gate metal layer comprises copper or copper alloy.

5. The method of claim 1, wherein edges of the gate pattern have a taper angle within a range of about 60° to about 90° with respect to the substrate.

6. The method of claim 1, wherein the second photo pattern and the portion of the first gate insulating layer disposed over the second photo pattern are removed at the same time.

7. The method of claim 1, wherein the second photo pattern is removed to expose the gate pattern.

8. The method of claim 1, wherein a width of the second photo pattern is the same as a width of the gate pattern.

9. The method of claim 1, wherein the second photo pattern has a reverse taper shape with respect to the substrate.

10. The method of claim 9, wherein a taper angle of the second photo pattern is within a range of about 90° to about 120°.

11. The method of claim 1, wherein the first gate insulating layer and the second insulating layer are disposed using a sputtering process.

12. The method of claim 1, wherein the first gate insulating layer and the second insulating layer comprise silicon oxide ($SiO_x$) or silicon nitride ($SiN_x$).

13. A method of manufacturing a display panel, the method comprising:
    forming a display substrate;
    disposing a plurality of gate lines;
    disposing a plurality of data lines; and
    disposing a plurality of pixels,
    wherein the forming the display substrate comprises:
      disposing a gate metal layer on a substrate;
      disposing a photoresist layer on the gate metal layer;
      etching portions of the photoresist layer to form a first photo pattern;
      etching portions of the gate metal layer to form a gate pattern comprising a gate electrode, wherein the gate metal layer is patterned using the first photo pattern as a mask;
      ashing an end portion of the first photo pattern to form a second photo pattern;
      disposing a first gate insulating layer over the substrate and the second photo pattern;
      removing the second photo pattern and a portion of the first gate insulating layer disposed over the second photo pattern; and
      disposing a second insulating layer over the gate pattern and the remaining portions of the first gate insulating layer.

14. The method of claim 13, wherein a thickness of the first gate insulating layer is smaller than a thickness of the gate pattern.

15. The method of claim 13, wherein a thickness of the gate pattern is within a range of about 1 μm to about 3 μm.

16. The method of claim 13, wherein a taper angle of the gate pattern is within a range of about 60° to about 90°.

17. The method of claim 13, wherein the second photo pattern is removed to expose the gate pattern.

18. The method of claim 13, wherein a width of the second photo pattern is the same as a width of the gate pattern.

19. The method of claim 13, wherein the second photo pattern has a reverse taper shape with respect to the substrate.

20. The method of claim 13, wherein the first gate insulating layer and the second insulating layer are disposed using a sputtering process.

* * * * *